(12) United States Patent
Kojo

(10) Patent No.: US 12,531,511 B2
(45) Date of Patent: Jan. 20, 2026

(54) OVEN-CONTROLLED CRYSTAL OSCILLATOR

(71) Applicant: DAISHINKU CORPORATION, Kakogawa (JP)

(72) Inventor: Takuya Kojo, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 898 days.

(21) Appl. No.: 17/783,001

(22) PCT Filed: Sep. 6, 2021

(86) PCT No.: PCT/JP2021/032700
§ 371 (c)(1),
(2) Date: Jun. 7, 2022

(87) PCT Pub. No.: WO2022/050414
PCT Pub. Date: Mar. 10, 2022

(65) Prior Publication Data
US 2023/0014023 A1    Jan. 19, 2023

(30) Foreign Application Priority Data
Sep. 7, 2020    (JP) ................................ 2020-149902

(51) Int. Cl.
*H03B 5/32* (2006.01)
*H03L 1/04* (2006.01)

(52) U.S. Cl.
CPC ................. *H03B 5/32* (2013.01); *H03L 1/04* (2013.01)

(58) Field of Classification Search
CPC .......... H03B 5/32; H03B 5/04; H03H 9/0533; H03H 9/0547; H03H 9/08; H03H 9/1014; H03H 9/02102; H03L 1/04
See application file for complete search history.

(56) References Cited

U.S. PATENT DOCUMENTS

| 10,630,255 | B2 * | 4/2020 | Iizuka ................. H03H 9/1035 |
| 2005/0285482 | A1 | 12/2005 | Oita et al. |
| 2018/0302033 | A1 | 10/2018 | Yamazaki et al. |
| 2019/0006988 | A1 * | 1/2019 | Kondo ..................... H03B 5/32 |
| 2020/0243746 | A1 | 7/2020 | Nomura |

FOREIGN PATENT DOCUMENTS

| JP | 2006-014208 A | 1/2006 |
| JP | 6376681 B2 | 8/2018 |
| JP | 2020-123804 A | 8/2020 |
| JP | 2020-123906 A | 8/2020 |

* cited by examiner

Primary Examiner — Emily P Pham
(74) Attorney, Agent, or Firm — METROLEX IP LAW GROUP, PLLC; Robert L. Scott, Esq.

(57) ABSTRACT

An oven-controlled crystal oscillator according to one or more embodiments includes a core section having at least an oscillation IC, a crystal resonator, and a heater IC. The core section is hermetically encapsulated in a heat-insulating package. The core section is supported by the package via a core substrate. The core substrate is connected to the package outside a region where the core section is provided in plan view.

8 Claims, 13 Drawing Sheets

OVEN-CONTROLLED CRYSTAL OSCILLATOR

TECHNICAL FIELD

The present invention relates to an oven-controlled crystal oscillator.

BACKGROUND ART

In a piezoelectric resonator such as a crystal resonator, the vibration frequency changes depending on the temperature according to its frequency temperature characteristics. In order to keep the temperature around the piezoelectric resonator constant, an oven-controlled crystal (Xtal) oscillator (hereinafter also referred to as an "OCXO") is known, in which a piezoelectric resonator is encapsulated in a thermostatic oven (for example, see Patent Document 1). The OCXO has a configuration, for example, in which a core section including an oscillation IC, a piezoelectric resonator, a heater IC and the like is hermetically encapsulated in a heat-insulating package. The core section is fixed to the package via a core substrate. In the OCXO, the heat quantity (the amount of heat) generated by a heating element (heat source) of the heater IC is controlled. Thus, the temperature of the core section is kept constant.

PATENT ART DOCUMENT

Patent Document

[Patent Document 1] JP 6376681

SUMMARY OF THE INVENTION

Problem to be Solved by the Invention

In the above-described OCXO, the core substrate is fixed to the package by, for example, a conductive adhesive or the like. Thus, the core substrate and the package are electrically connected to each other via the conductive adhesive or the like. In this case, heat of the core section may transfer (leak) via connection parts of the core substrate and the package, which may cause the amount of heat generated by the heater, which is required to maintain the temperature of the core section, to increase by the heat amount transferred to the package via the connection parts. As a result, heat consumption may increase.

The present invention was made in consideration of the above circumstances, an object of which is to provide an oven-controlled crystal oscillator capable of reducing, as much as possible, an amount of heat generated by a heater to maintain the temperature of a core section.

Means for Solving the Problem

The present invention has a following configuration as means for solving the above problem. That is, an oven-controlled crystal oscillator of the present invention includes a core section having at least an oscillation IC, a piezoelectric resonator, and a heater IC. The core section is hermetically encapsulated in a heat-insulating package. The core section is supported by the package via a core substrate. The core substrate is connected to the package outside a region where the core section is provided in plan view. In this case, it is preferable that the core substrate is connected to the package by mechanical connection.

In this configuration, the connecting parts of the core substrate and the package are not provided at the positions that are superimposed on the core section in plan view, and furthermore are provided at the positions away from the core section. Thus, heat of the core section is not likely to transfer (leak) to the package via the connecting parts of the core substrate and the package, and therefore, a large portion of heat generated from the heating element of the heater IC can be maintained within the core section. Thus, it is possible to reduce, as much as possible, the amount of heat generated by the heater that is necessary to maintain the temperature of the core section, which leads to reduction in power consumption of the OCXO. Also, since the core section is fixed to the package via the core substrate, stress from a mounting board on which the OCXO is mounted is not likely to transfer to the core section, which results in protection of the core section.

In the above-described configuration, it is preferable that a void space is provided between the core substrate and an inner bottom surface of the package.

With the above-described configuration, since the void space is provided between the core substrate and the inner bottom surface of the package, it is possible to improve heat insulation of the core section by the void space. Thus, it is possible to further reduce the amount of heat generated by the heater that is necessary to maintain the temperature of the core section, which leads to further reduction in power consumption of the OCXO.

In the above-described configuration, it is preferable that the core substrate is bonded to the package by an adhesive, and that the void space is formed by the adhesive interposed between the core substrate and the package.

With the above-described configuration, it is possible to form the void space between the core substrate and the inner bottom surface of the package by a simple method using the adhesive to bond the core substrate and the package.

In the above-described configuration, it is preferable that a pair of step parts facing each other is formed inside the package, and that the void space is formed by a recess part formed between the pair of step parts.

With the above-described configuration, since the step parts are provided, it is possible to reliably ensure the void space between the core substrate and the inner bottom surface of the package. Also, in the event that the adhesive to bond the core substrate and the package overflows to the inner bottom surface of the package, the adhesive flows into the recess part. Thus, it is possible to prevent short circuit due to contact of the adhesives.

In the above-described configuration, it is preferable that the recess part is formed at a position corresponding to the core section in plan view.

With the above-described configuration, since the recess part is provided at a position corresponding to the core section (for example, under the core section), it is possible to further improve heat insulation of the core section by the recess part.

In the above-described configuration, it is preferable that the piezoelectric resonator includes: a first sealing member and a second sealing member both made of glass or crystal; and a piezoelectric resonator plate made of crystal and having a vibrating part, on respective main surfaces of which excitation electrodes are formed. Furthermore, it is preferable that the first sealing member and the second sealing member are laminated and bonded to each other via the piezoelectric resonator plate so as to hermetically seal the vibrating part of the piezoelectric resonator plate in an internal space.

With the above-described configuration, the piezoelectric resonator having the sandwich structure is used as the piezoelectric resonator of the core section, which hermetically seals the vibrating part as described above in the inside. Thus, it is possible to reduce the height and the size of the core section, and the heat capacity of the core section can be reduced. Therefore, it is possible to reduce the amount of heat generated by the heater of the OCXO, which leads to low power consumption. Furthermore, the temperature followability of the core section can be improved, which also improves the stability of the OCXO. In addition, in the piezoelectric resonator having the sandwich structure, since the vibrating part is hermetically sealed without using any adhesive, it is possible to prevent thermal convection by outgas generated by the adhesive from affecting. That is, when the adhesive is used, the thermal convection may be generated, in the space in which the vibrating part is hermetically sealed, by circulation of outgas generated by the adhesive, which may prevent the temperature of the vibrating part from being accurately adjusted. However, the piezoelectric resonator having the sandwich structure does not generate outgas. Thus, it is possible to accurately control the temperature of the vibrating part.

Effects of the Invention

In the oven-controlled crystal oscillator of the present invention, the connecting parts of the core substrate and the package are not provided at the positions that are superimposed on the core section in plan view, and furthermore are provided at the positions away from the core section. Thus, heat of the core section is not likely to transfer to the package via the connecting parts of the core substrate and the package, and therefore, a large portion of heat generated from the heating element of the heater IC can be maintained within the core section. Thus, it is possible to reduce, as much as possible, the amount of heat generated by the heater that is necessary to maintain the temperature of the core section, which leads to reduction in power consumption.

MODE FOR CARRYING OUT THE INVENTION

Hereinafter, an embodiment of the present invention will be described with reference to the drawings.

Figure 1:
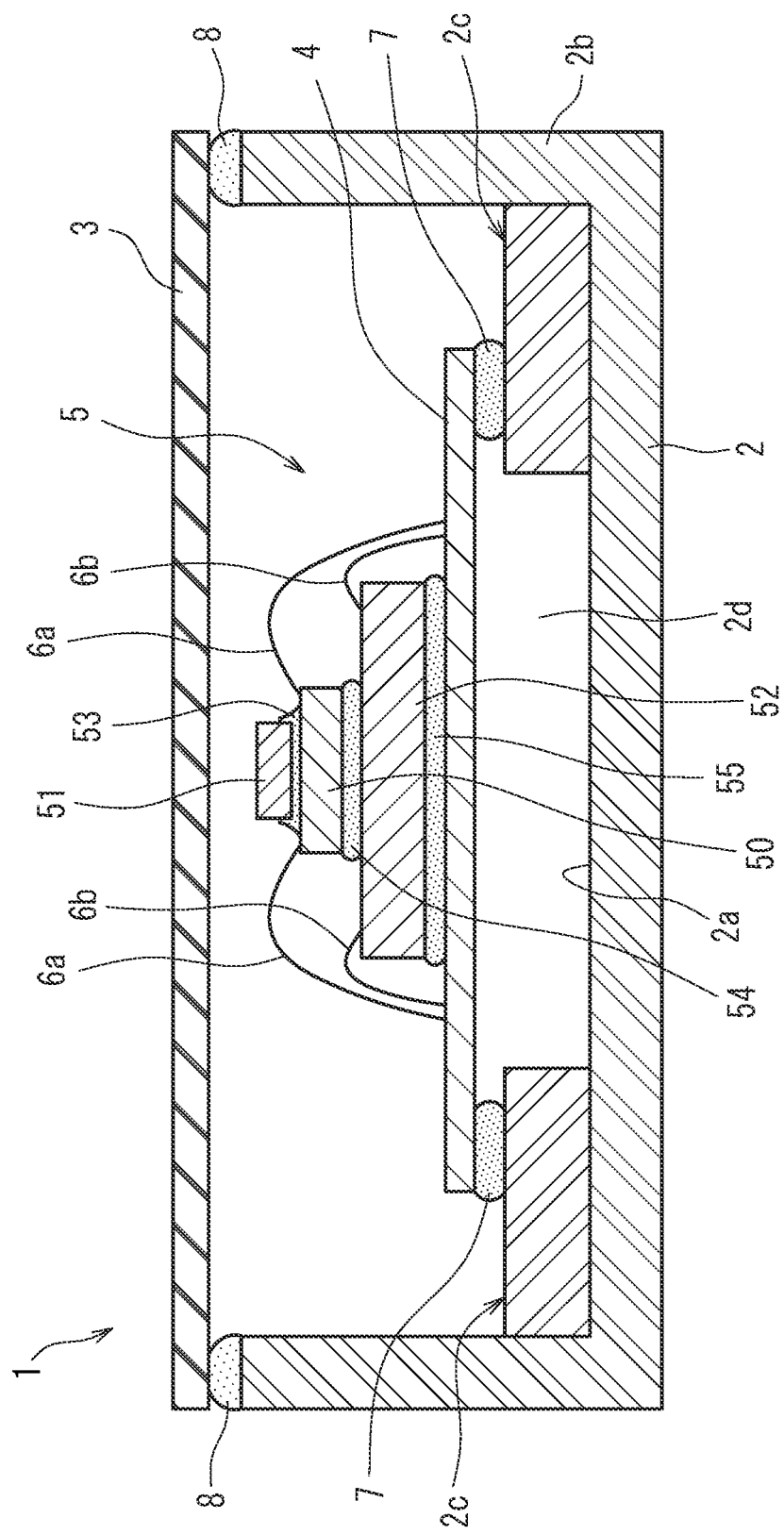
FIG. 1 is a cross-sectional view illustrating a schematic configuration of an OCXO according to an embodiment.

As shown in FIG. 1, an OCXO 1 according to this embodiment has a configuration in which a core section 5 is disposed in a package (housing) 2 made of ceramic or the like and having a substantially rectangular parallelepiped shape such that the core section 5 is hermetically sealed by a lid 3. The package 2 has, for example, a package size of 7.0×5.0 mm. The package 2 includes a recess part 2a whose upper part is opened, and the core section 5 is hermetically encapsulated in the recess part 2a. To an upper surface of a peripheral wall part 2b that surrounds the recess part 2a, the lid 3 is fixed by a sealant 8. Thus, the inside of the package 2 is hermetically sealed (in an airtight state). As the sealant 8, a metal sealant such as Au-Su alloy and solder is suitably used, however, other sealants including low melting point glass may also be used. The space inside the package 2 is preferably a vacuum atmosphere or an atmosphere with low thermal conductivity with low pressure nitrogen or low pressure argon.

Step parts 2c are formed on an inner wall surface of the peripheral wall part 2b of the package 2 so as to be along the arrangement of connection terminals (not shown). The core section 5 is connected to the connection terminals formed on the step parts 2c via a plate-like core substrate 4. The core substrate 4 is made of, for example, crystal. Also, the core substrate 4 may be made of a resin material having heat resistance and flexibility such as polyimide.

The core substrate 4 is disposed so as to be bridged between a facing pair of step parts 2c of the package 2. A void space 2d is formed under the core substrate 4, between the pair of step parts 2c. Connection terminals formed on step surfaces of the step parts 2c are connected to connection terminals (not shown) formed on a rear surface 4b of the core substrate 4 via a conductive adhesive 7. Also, external terminals (not shown) formed on respective components of the core section 5 are connected to connection terminals 4c formed on a front surface 4a of the core substrate 4, by wire bonding via wires 6a and 6b. A polyimide adhesive or an epoxy adhesive is used, for example, as the conductive adhesive 7.

Figure 2:
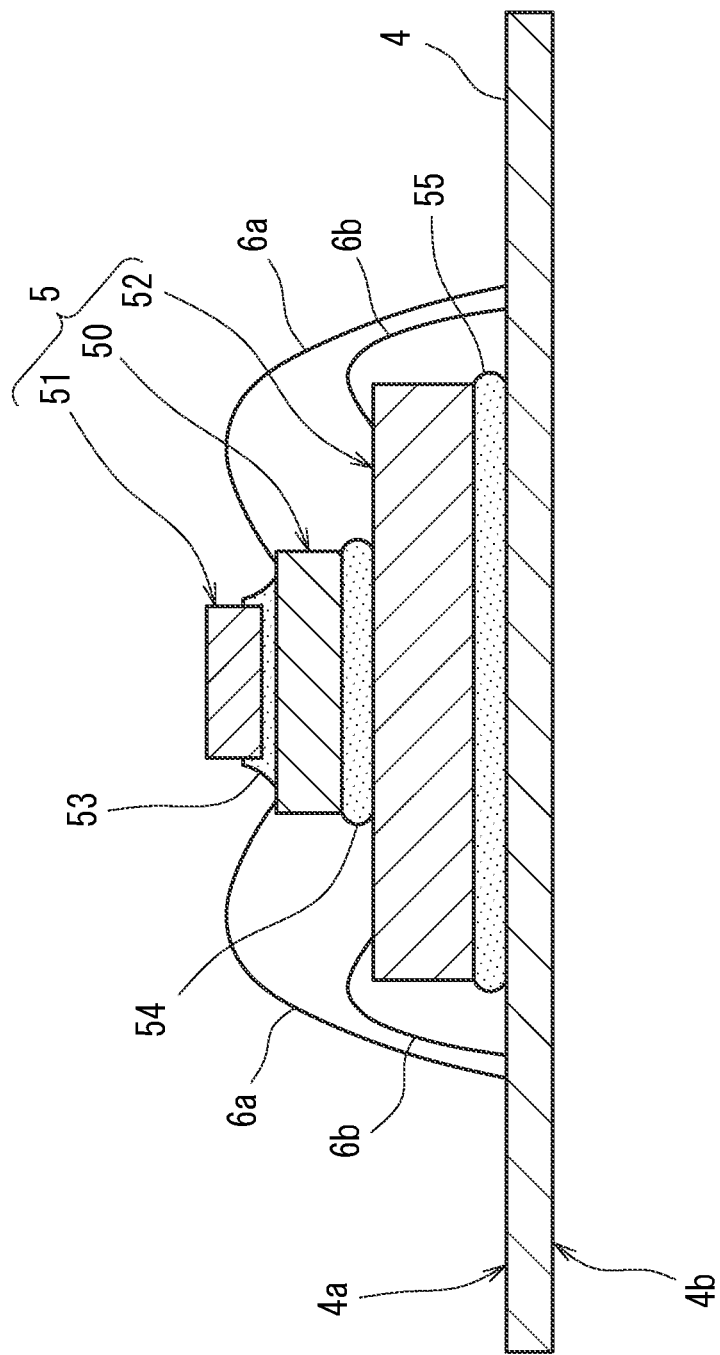
FIG. 2 is a cross-sectional view illustrating a schematic configuration of a core section and a core substrate of the OCXO of FIG. 1.
Figure 3:
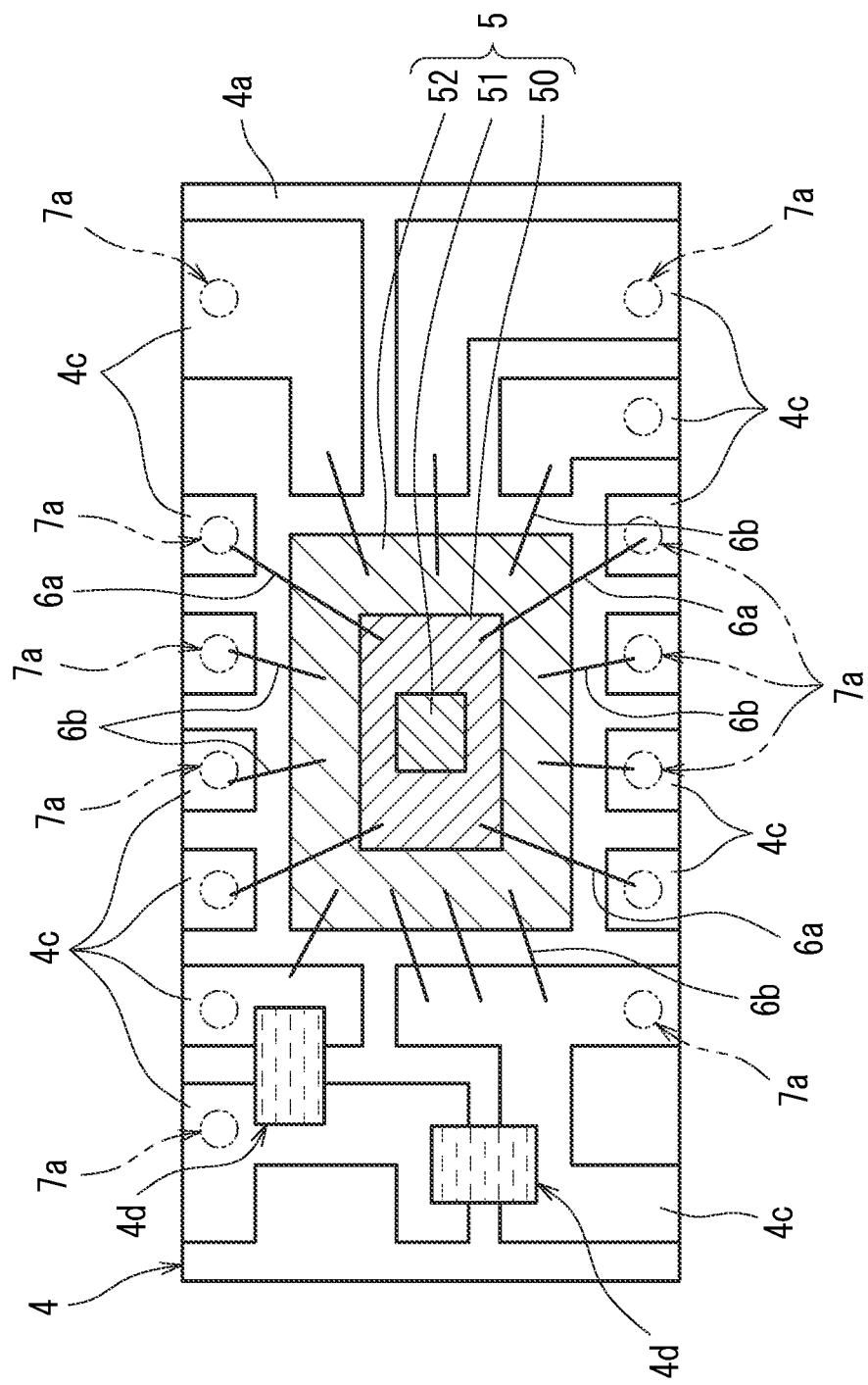
FIG. 3 is a plan view illustrating the core section and the core substrate of FIG. 2.

Here, the core section 5 is described referring to FIGS. 2 and 3. FIGS. 2 and 3 show the core section 5 mounted on the core substrate 4. FIG. 2 shows a cross-section taken from a line along the short side direction of the core substrate 4 of FIG. 3 (FIG. 1 also shows a cross-section similar to the above). The core section 5 packages various electronic components used for the OCXO 1, and has a three-layer structure (layered structure) in which an oscillation IC 51, a crystal resonator 50 and a heater IC 52 are laminated in this order from the uppermost layer side. The oscillation IC 51, the crystal resonator 50 and the heater IC 52 respectively have areas in plan view that become gradually smaller from the downside to the upside. The core section 5 stabilizes oscillation frequency of the OCXO 1 by especially adjusting the temperatures of the crystal resonator 50, the oscillation IC 51 and the heater IC 52, whose temperature characteristics are large. The electronic components of the core section 5 are not sealed by a sealing resin, however, depending on the sealing atmosphere, the electronic components may be sealed by the sealing resin.

A crystal oscillator 100 is constituted of the crystal resonator 50 and the oscillation IC 51. The oscillation IC 51 is mounted on the crystal resonator 50 via a plurality of metal bumps 51*a* (see FIG. 4). The oscillation frequency of the OCXO 1 is controlled by controlling the piezoelectric vibration of the crystal resonator 50 by the oscillation IC 51. The crystal oscillator 100 will be described later in detail.

Between the facing surfaces of the crystal resonator 50 and the oscillation IC 51, a non-conductive adhesive (underfill) 53 is interposed, which fixes the respective facing surfaces of the crystal resonator 50 and the oscillation IC 51 to each other. In this case, the front surface (a first main surface 201 of a first sealing member 20) of the crystal resonator 50 is bonded to the rear surface of the oscillation IC 51 via the non-conductive adhesive 53. As the non-conductive adhesive 53, a polyimide adhesive or an epoxy adhesive is, for example, used. Also, external terminals (electrode patterns 22 shown in FIG. 5) formed on the front surface of the crystal resonator 50 are connected to the connection terminals 4*c* formed on the front surface 4*a* of the core substrate 4, by wire bonding via the wires 6*a*.

The oscillation IC 51 has the area smaller than the area of the crystal resonator 50 in plan view. Thus, the whole oscillation IC 51 is disposed within the area of the crystal resonator 50 in plan view. Also, all the rear surface of the oscillation IC 51 is bonded to the front surface (the first main surface 201 of the first sealing member 20) of the crystal resonator 50.

The heater IC 52 has a configuration in which a heating element (a heat source), a control circuit for controlling the temperature of the heating element (a current control circuit) and a temperature sensor for detecting the temperature of the heating element are integrally formed. By controlling the temperature of the core section 5 by the heater IC 52, it is possible to keep the temperature of the core section 5 substantially constant, which contributes to stabilization of the oscillation frequency of the OCXO 1.

Between the facing surfaces of the crystal resonator 50 and the heater IC 52, a non-conductive adhesive 54 is interposed, which fixes the respective facing surfaces of the crystal resonator 50 and the heater IC 52 to each other. In this case, the rear surface (a second main surface 302 of a second sealing member 30) of the crystal resonator 50 is bonded to the front surface of the heater IC 52 via the non-conductive adhesive 54. As the non-conductive adhesive 54, a polyimide adhesive or an epoxy adhesive is, for example, used. Also, external terminals (not shown) formed on the front surface of the heater IC 52 are connected to the connection terminals 4*c* formed on the front surface 4*a* of the core substrate 4, by wire bonding via the wires 6*b*.

The crystal resonator 50 has the area smaller than the area of the heater IC 52 in plan view. Thus, the whole crystal resonator 50 is disposed within the area of the heater IC 52 in plan view. Also, all the rear surface of the crystal resonator 50 (the second main surface 302 of the second sealing member 30) is bonded to the front surface of the heater IC 52.

Between the facing surfaces of the heater IC 52 and the core substrate 4, a conductive adhesive 55 is interposed, which fixes the respective facing surfaces of the heater IC 52 and the core substrate 4 to each other. In this case, the rear surface of the heater IC 52 is bonded to the front surface 4*a* of the core substrate 4 via the conductive adhesive 55. Thus, the heater IC 52 is connected to ground via the conductive adhesive 55 and the core substrate 4. As the conductive adhesive 55, a polyimide adhesive or an epoxy adhesive is, for example, used. In the case where the heater IC 52 is connected to ground via wires or the like, a non-conductive adhesive such as the non-conductive adhesives 53 and 54 may be used in place of the conductive adhesive.

On the front surface 4*a* of the core substrate 4, various connection terminals 4*c* are formed as described above. Also, on the front surface 4*a* of the core substrate 4, a plurality of (in FIG. 3, two) chip capacitors (bypass capacitors) 4*d* is disposed. However, the size or the number of the chip capacitors 4*d* is not particularly limited.

On the rear surface 4*b* of the core substrate 4, various connection terminals are formed and connected to the connection terminals formed on the package 2 via the conductive adhesive 7, as described above. In FIG. 3, each connecting part 7*a* where the core substrate 4 and the package 2 are connected to each other via the conductive adhesive 7 is indicated by the long dashed double-dotted line. The connection terminals on the rear surface 4*b* of the core substrate 4 are respectively located so as to correspond to the connection terminals 4*c* on the front surface 4*a* of the core substrate 4. Among the connection terminals on the rear surface 4*b* of the core substrate 4, the conductive adhesive 7 is applied to the connection terminals that are used to be connected to the connection terminals on the package 2. Thus, each part to which the conductive adhesive 7 is applied is defined as the connecting part 7*a*. The connecting parts 7*a* to which the conductive adhesive 7 is applied are provided on the peripheral part of the core substrate 4 in plan view. More specifically, the connecting parts 7*a* are aligned at predetermined intervals on the region along a pair of long sides facing each other of the core substrate 4. The region along the facing pair of long sides of the core substrate 4 is located above the facing pair of step parts 2*c* of the package 2.

Although the kind of the crystal resonator 50 used for the core section 5 is not particularly limited, a device having a sandwich structure is suitably used, which serves to make the device thinner. The device having the sandwich structure is constituted of: the first sealing member and the second sealing member both made of glass or crystal; and a piezoelectric resonator plate made of, for example, crystal. The piezoelectric resonator plate includes a vibrating part, on respective main surfaces of which excitation electrodes are formed. The first sealing member and the second sealing member are laminated and bonded via the piezoelectric resonator plate. Thus, the vibrating part of the piezoelectric resonator plate is hermetically sealed in an internal space.

The crystal oscillator 100 integrally formed by the sandwich-structured crystal resonator 50 and the oscillation IC 51 is described referring to FIGS. 4 to 10.

Figure 4:
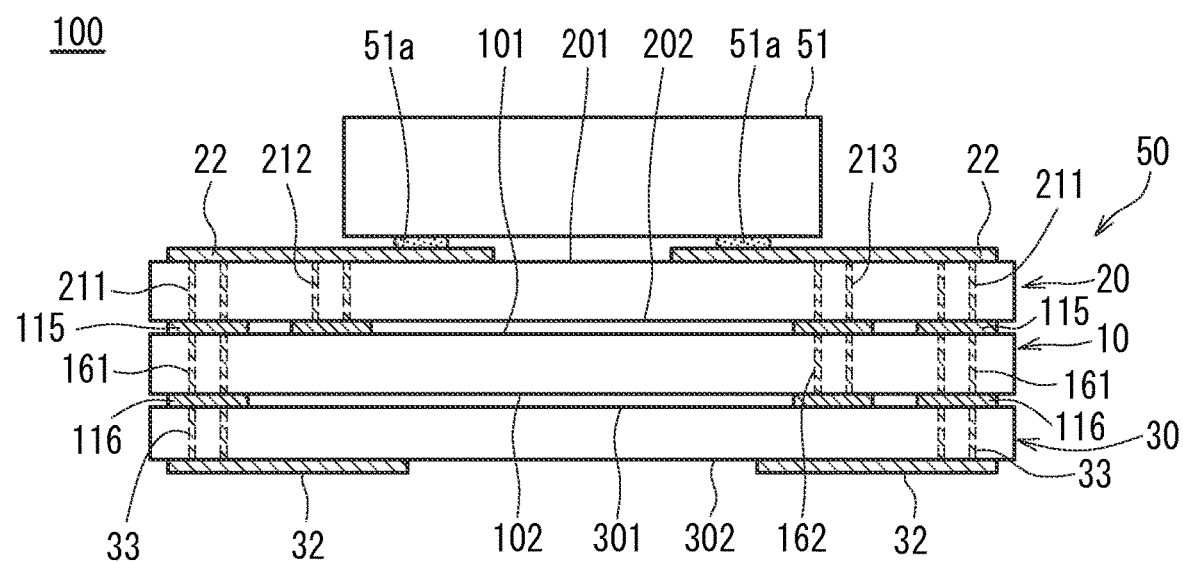
FIG. 4 is a schematic configuration diagram schematically illustrating a configuration of a crystal oscillator (a crystal resonator and an oscillation IC) of the core section of FIG. 2.

As shown in FIG. 4, the crystal oscillator 100 includes: a crystal resonator plate (piezoelectric resonator plate) 10; the first sealing member 20; the second sealing member 30; and the oscillation IC 51. In this crystal oscillator 100, the crystal resonator plate 10 is bonded to the first sealing member 20, and furthermore the crystal resonator plate 10 is bonded to the second sealing member 30. Thus, a package having a sandwich structure is formed so as to have a substantially rectangular parallelepiped shape. In the crystal oscillator 100, the first sealing member 20 and the second sealing member 30 are bonded to respective main surfaces of the crystal resonator plate 10, thus an internal space (cavity) of the package is formed. In this internal space, a vibrating part 11 (see FIGS. 7 and 8) is hermetically sealed.

The crystal oscillator 100 has, for example, a package size of 1.0×0.8 mm, which is reduced in size and height. According to the size reduction, no castellation is formed in the package. Through holes are used for conduction between electrodes. The oscillation IC 51 mounted on the first sealing member 20 is a one-chip integrated circuit element constituting, with the crystal resonator plate 10, an oscillation circuit. Also, the crystal oscillator 100 is mounted on the above-described heater IC 52 via the non-conductive adhesive 54.

Figure 7:
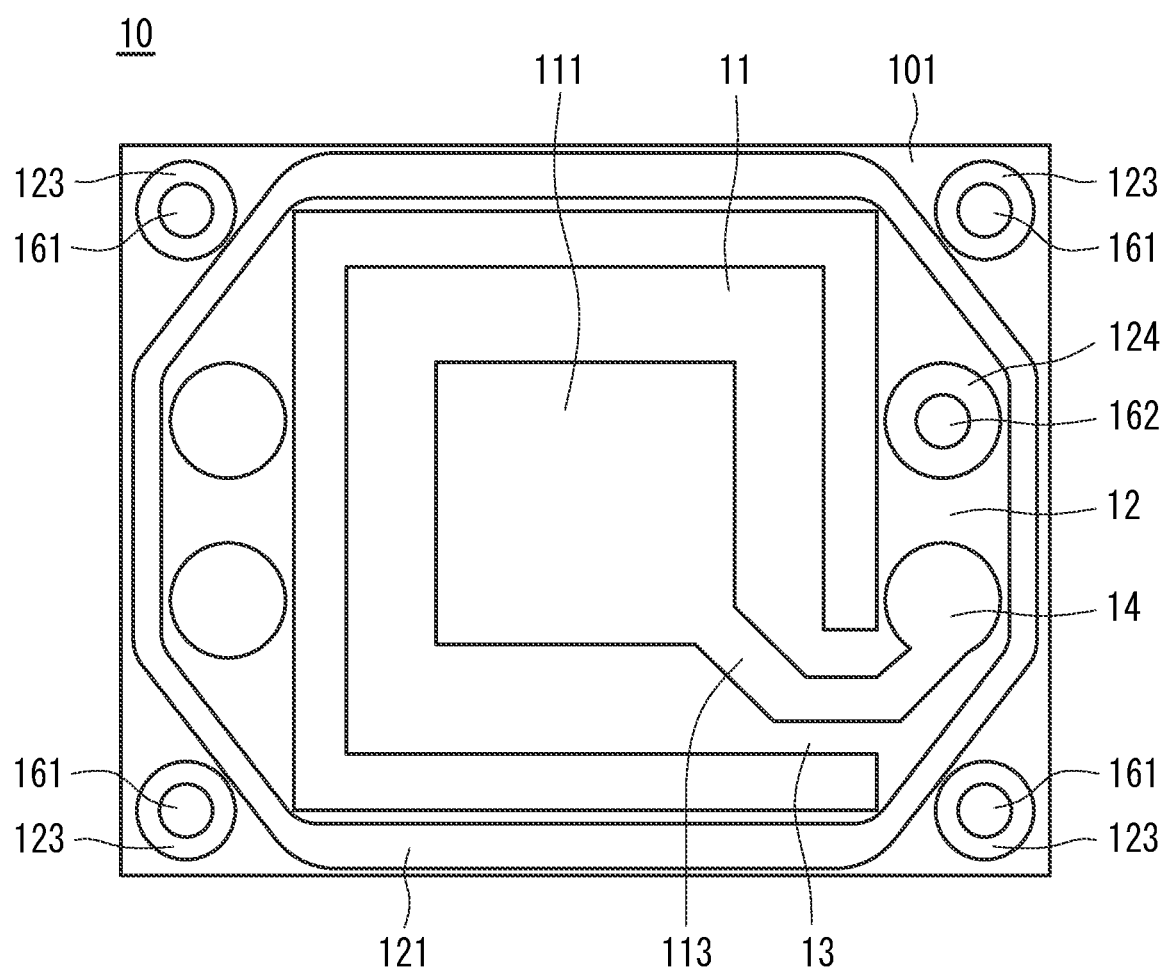
FIG. 7 is a schematic plan view illustrating a first main surface of a crystal resonator plate of the crystal oscillator of FIG. 4.
Figure 7:
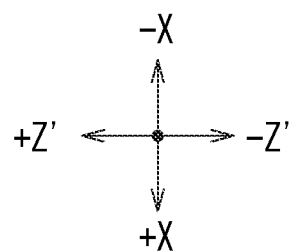
Figure 8:
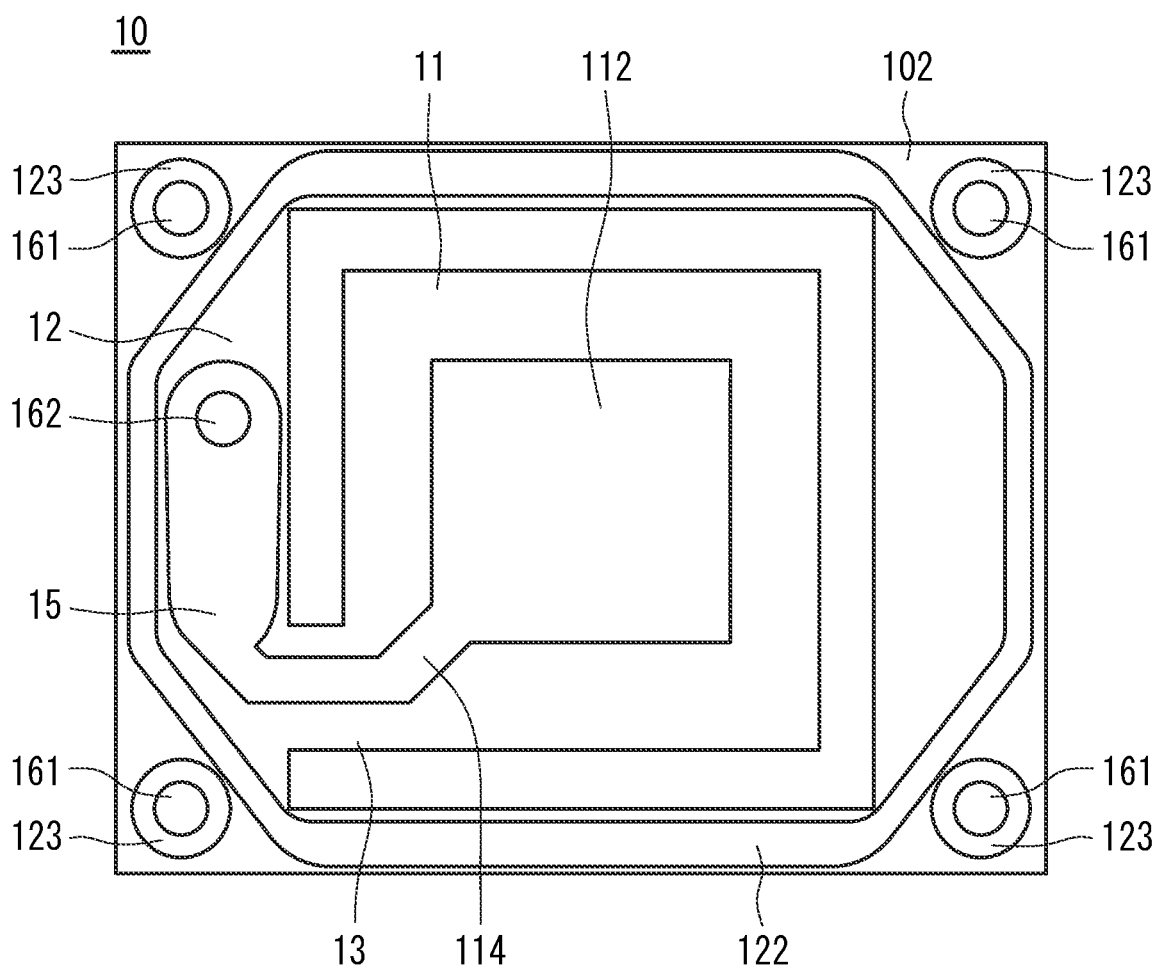
FIG. 8 is a schematic plan view illustrating a second main surface of the crystal resonator plate of the crystal oscillator of FIG. 4.
Figure 8:
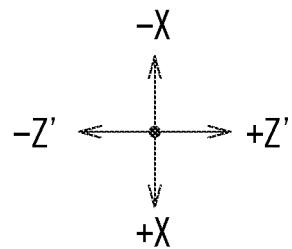

The crystal resonator plate 10 is a piezoelectric substrate made of crystal as shown in FIGS. 7 and 8. Each main surface (i.e. a first main surface 101 and a second main surface 102) is formed as a smooth flat surface (mirror-finished). An AT-cut crystal plate that causes thickness shear vibration is used as the crystal resonator plate 10. In the crystal resonator plate 10 shown in FIGS. 7 and 8, each main surface 101 and 102 of the crystal resonator plate 10 is an XZ' plane. On this XZ' plane, the direction parallel to the lateral direction (short side direction) of the crystal resonator plate 10 is the X axis direction, and the direction parallel to the longitudinal direction (long side direction) of the crystal resonator plate 10 is the Z' axis direction.

A pair of excitation electrodes (i.e. a first excitation electrode 111 and a second excitation electrode 112) is formed, respectively, on the main surfaces 101 and 102 of the crystal resonator plate 10. The crystal resonator plate 10 includes: the vibrating part 11 formed so as to have a substantially rectangular shape; an external frame part 12 surrounding the outer periphery of the vibrating part 11; and a support part (connecting part) 13 that supports the vibrating part 11 by connecting the vibrating part 11 to the external frame part 12. That is, the crystal resonator plate 10 has a configuration in which the vibrating part 11, the external frame part 12 and the support part 13 are integrally formed. The support part 13 extends (protrudes) from only one corner part positioned in the +X direction and in the −Z' direction of the vibrating part 11 to the external frame part 12 in the −Z' direction.

The first excitation electrode 111 is provided on the first main surface 101 side of the vibrating part 11 while the second excitation electrode 112 is provided on the second main surface 102 side of the vibrating part 11. The first excitation electrode 111 and the second excitation electrode 112 are respectively connected to lead-out wirings (a first lead-out wiring 113 and a second lead-out wiring 114) so that these excitation electrodes are connected to external electrode terminals. The first lead-out wiring 113 is drawn from the first excitation electrode 111 and connected to a connection bonding pattern 14 formed on the external frame part 12 via the support part 13. The second lead-out wiring 114 is drawn from the second excitation electrode 112 and connected to a connection bonding pattern 15 formed on the external frame part 12 via the support part 13.

Resonator-plate-side sealing parts to bond the crystal resonator plate 10 respectively to the first sealing member 20 and the second sealing member 30 are provided on the respective main surfaces (i.e. the first main surface 101 and the second main surface 102) of the crystal resonator plate 10. As the resonator-plate-side sealing part on the first main surface 101, a resonator-plate-side first bonding pattern 121 is formed. As the resonator-plate-side sealing part on the second main surface 102, a resonator-plate-side second bonding pattern 122 is formed. The resonator-plate-side first bonding pattern 121 and the resonator-plate-side second bonding pattern 122 are each formed on the external frame part 12 so as to have an annular shape in plan view.

Also, as shown in FIGS. 7 and 8, five through holes are formed in the crystal resonator plate 10 so as to penetrate between the first main surface 101 and the second main surface 102. More specifically, four first through holes 161 are respectively disposed in the four corners (corner parts) of the external frame part 12. A second through hole 162 is disposed in the external frame part 12, on one side in the Z' axis direction relative to the vibrating part 11 (in FIGS. 7 and 8, on the side in the −Z' direction). Connection bonding patterns 123 are formed on the respective peripheries of the first through holes 161. Also, on the periphery of the second through hole 162, a connection bonding pattern 124 is formed on the first main surface 101 side while the connection bonding pattern 15 is formed on the second main surface 102 side.

In the first through holes 161 and the second through hole 162, through electrodes are respectively formed along a corresponding inner wall surface of the above through holes so as to establish conduction between the electrodes formed on the first main surface 101 and the second main surface 102. Respective center parts of the first through holes 161 and the second through hole 162 are hollow penetrating parts penetrating between the first main surface 101 and the second main surface 102.

Figure 5:
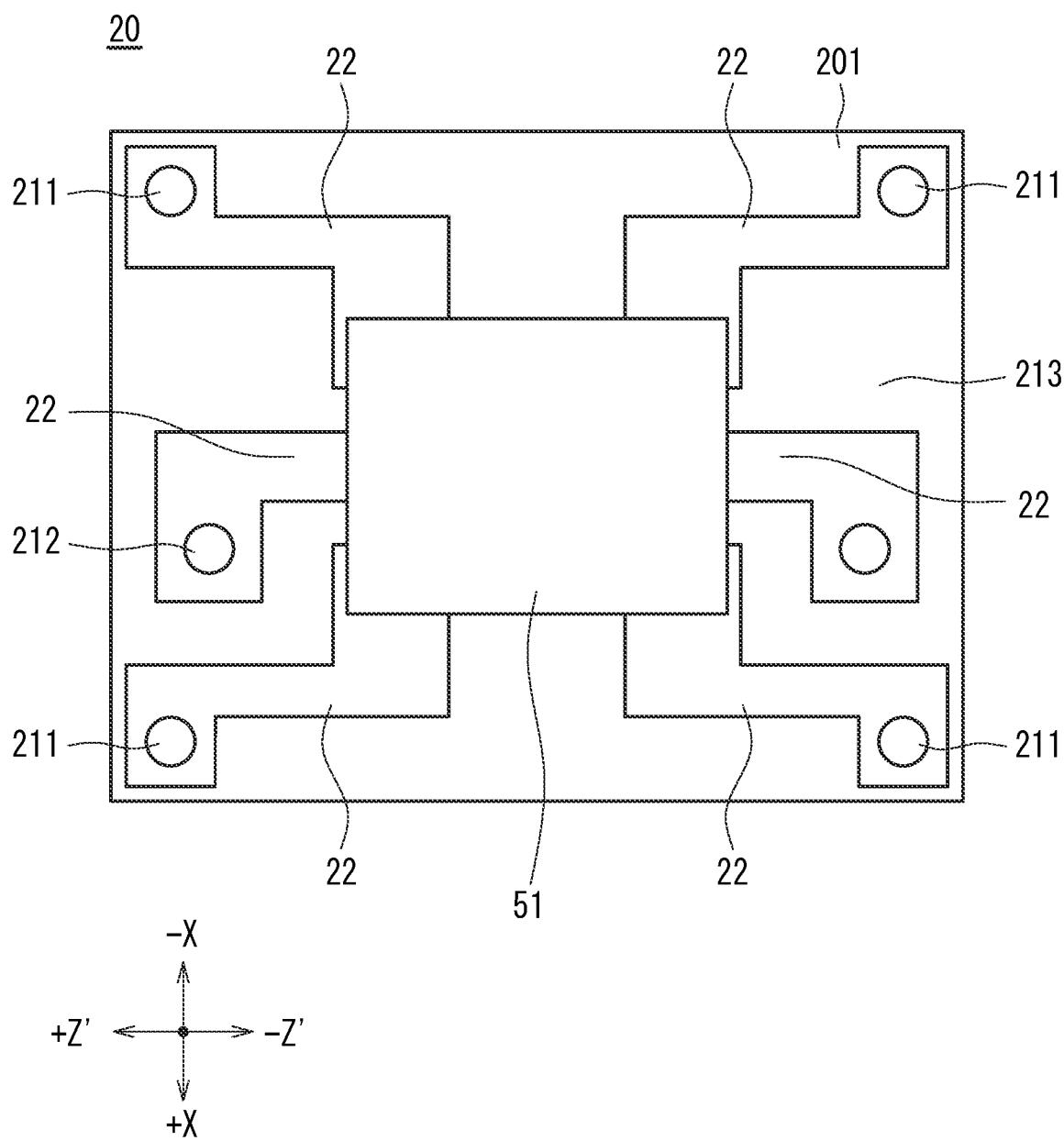
FIG. 5 is a schematic plan view illustrating a first main surface of a first sealing member of the crystal oscillator of FIG. 4.
Figure 6:
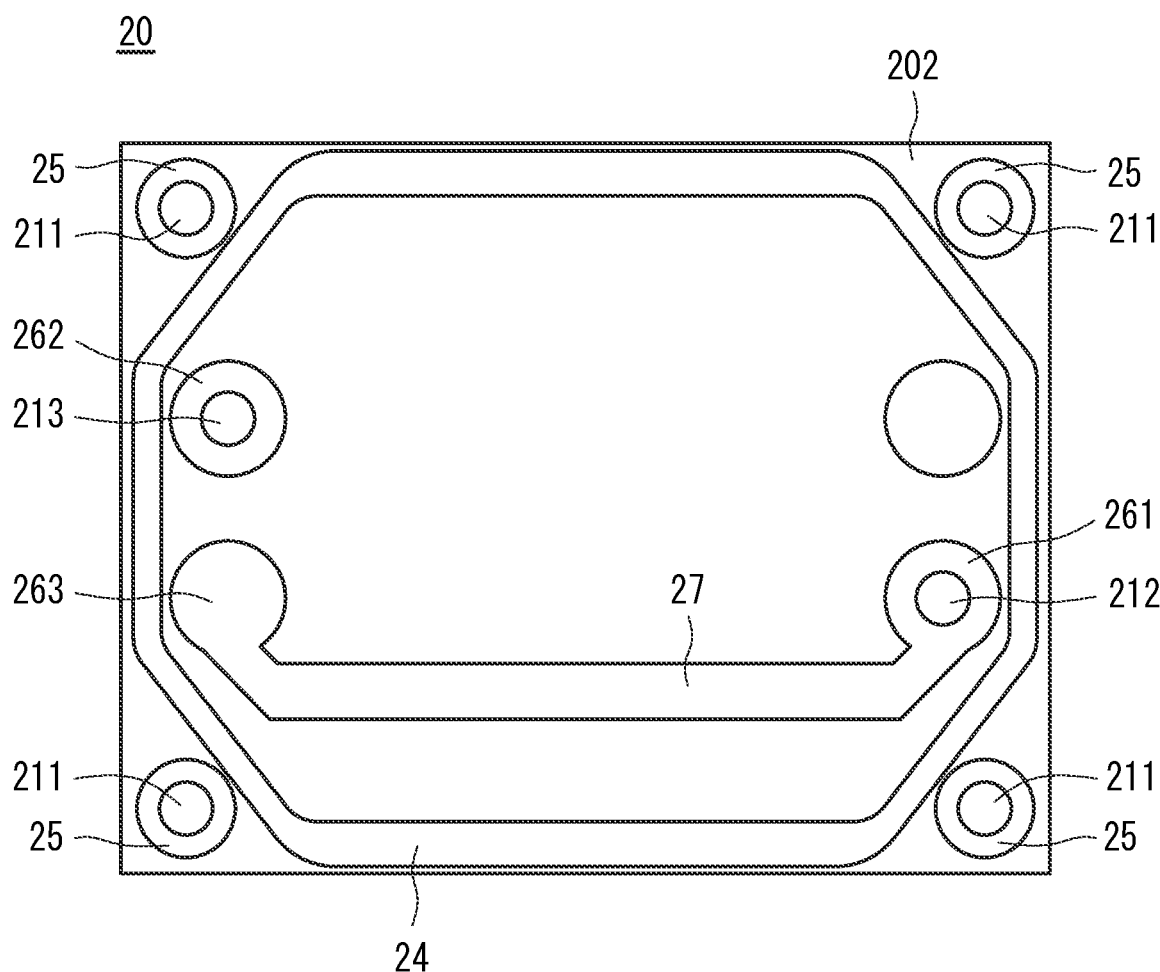
FIG. 6 is a schematic plan view illustrating a second main surface of the first sealing member of the crystal oscillator of FIG. 4.

As shown in FIGS. 5 and 6, the first sealing member 20 is a substrate having a rectangular parallelepiped shape that is made of a single AT-cut crystal plate. A second main surface 202 (a surface to be bonded to the crystal resonator plate 10) of the first sealing member 20 is formed as a smooth flat surface (mirror finished). By making the first sealing member 20, which does not have the vibrating part, of the AT-cut crystal plate as in the case of the crystal resonator plate 10, it is possible for the first sealing member 20 to have the same coefficient of thermal expansion as the crystal resonator plate 10. Thus, it is possible to prevent thermal deformation of the crystal oscillator 100. Furthermore, the respective directions of the X axis, Y axis and Z' axis of the first sealing member 20 are the same as those of the crystal resonator plate 10.

As shown in FIG. 5, on the first main surface 201 of the first sealing member 20, six electrode patterns 22 are formed, which include mounting pads for mounting the oscillation IC 51 as an oscillation circuit element. The oscillation IC 51 is bonded to the electrode patterns 22 by the flip chip bonding (FCB) method using the metal bumps (for example, Au bumps) 51a (see FIG. 4). Also in this embodiment, among the six electrode patterns 22, the electrode patterns 22 provided on the four corners (corner parts) of the first main surface 201 of the first sealing member 20 are connected to the connection terminals 4c formed on the front surface 4a of the core substrate 4 as described above, via the wires 6a. In this way, the oscillation IC 51 is electrically connected to the outside via the wires 6a, the core substrate 4, the conductive adhesive 7, the package 2 and the like.

As shown in FIGS. 5 and 6, six through holes are formed in the first sealing member 20 so as to be respectively connected to the six electrode patterns 22 and also to penetrate between the first main surface 201 and the second main surface 202. More specifically, four third through holes 211 are respectively disposed in the four corners (corner parts) of the first sealing member 20. Fourth and fifth through holes 212 and 213 are disposed respectively in the +Z' direction and in the −Z' direction in FIGS. 5 and 6.

In the third through holes 211 and the fourth and fifth through holes 212 and 213, through electrodes are respectively formed along a corresponding inner wall surface of the above through holes so as to establish conduction between the electrodes formed on the first main surface 201 and the second main surface 202. Respective center parts of the third through holes 211 and the fourth and fifth through holes 212 and 213 are hollow penetrating parts penetrating between the first main surface 201 and the second main surface 202.

On the second main surface 202 of the first sealing member 20, a sealing-member-side first bonding pattern 24 is formed as a sealing-member-side first sealing part so as to be bonded to the crystal resonator plate 10. The sealing-member-side first bonding pattern 24 is formed so as to have an annular shape in plan view.

On the second main surface 202 of the first sealing member 20, connection bonding patterns 25 are respectively formed on the peripheries of the third through holes 211. A connection bonding pattern 261 is formed on the periphery of the fourth through hole 212, and a connection bonding pattern 262 is formed on the periphery of the fifth through hole 213. Furthermore, a connection bonding pattern 263 is formed on the side opposite to the connection bonding pattern 261 in the long axis direction of the first sealing member 20 (i.e. on the side in the −Z' direction). The connection bonding pattern 261 and the connection bonding pattern 263 are connected to each other via a wiring pattern 27.

Figure 9:
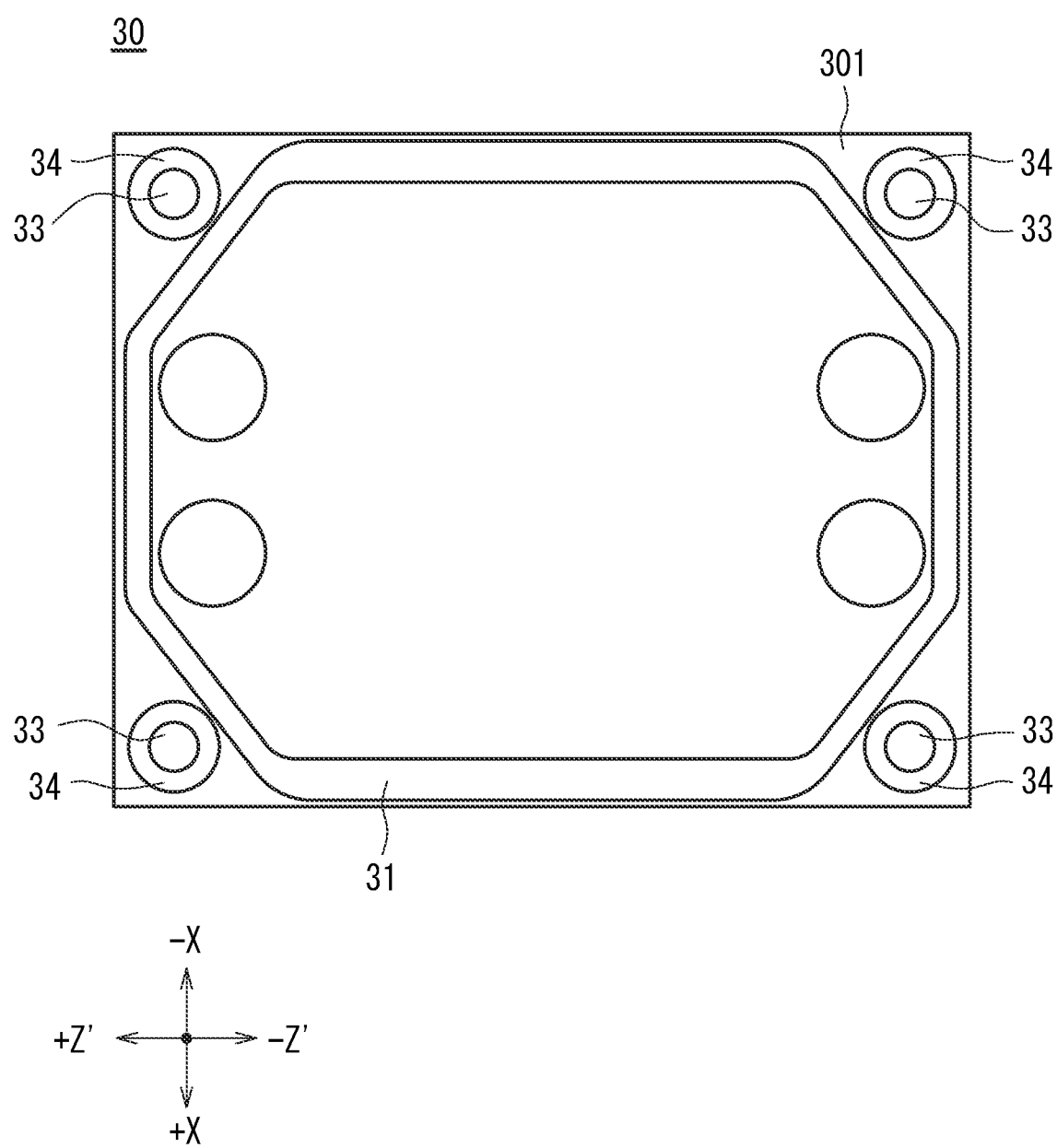
FIG. 9 is a schematic plan view illustrating a first main surface of a second sealing member of the crystal oscillator of FIG. 4.
Figure 10:
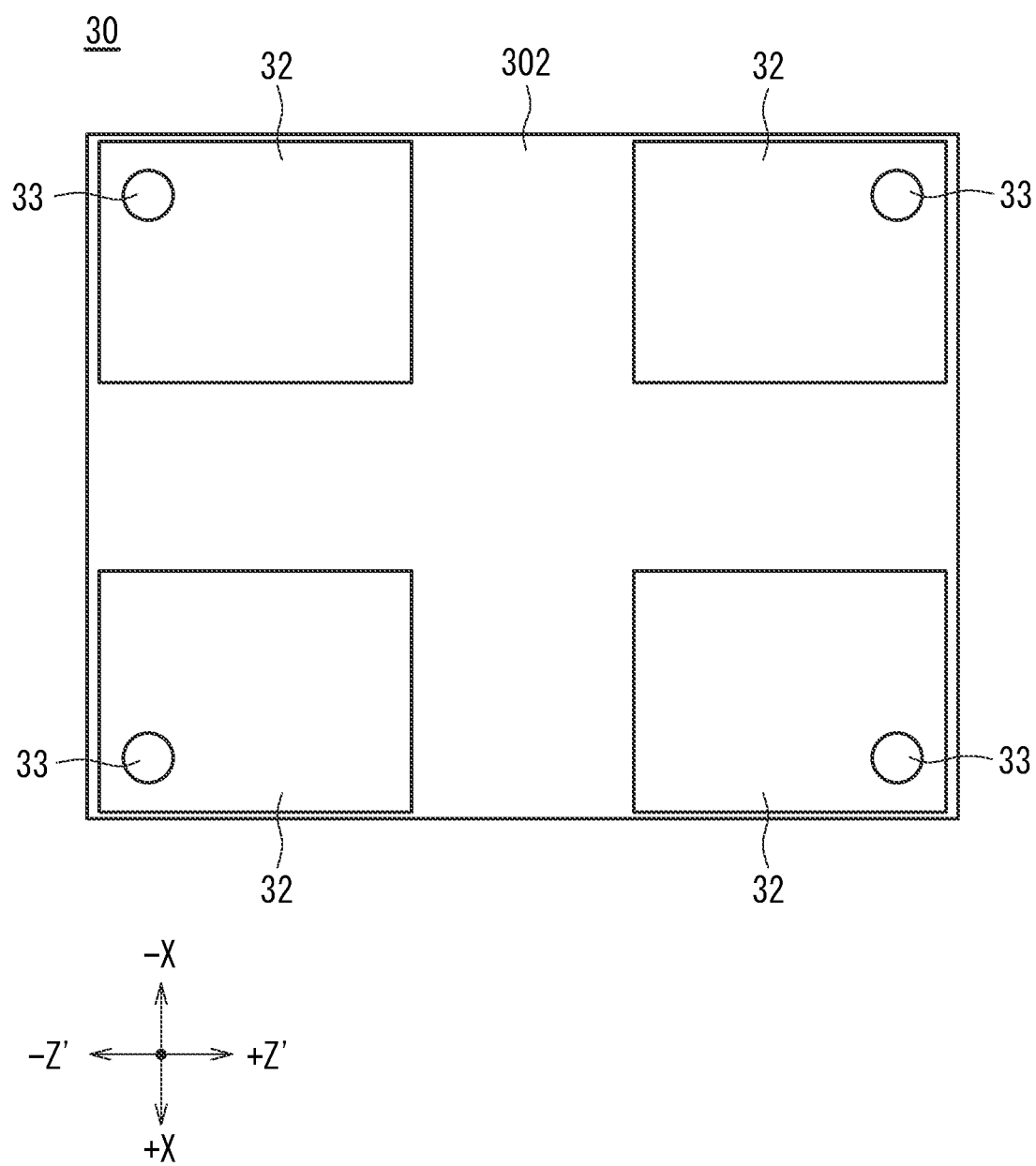
FIG. 10 is a schematic plan view illustrating a second main surface of the second sealing member of the crystal oscillator of FIG. 4.

As shown in FIGS. 9 and 10, the second sealing member 30 is a substrate having a rectangular parallelepiped shape that is made of a single AT-cut crystal plate. A first main surface 301 (a surface to be bonded to the crystal resonator plate 10) of the second sealing member 30 is formed as a smooth flat surface (mirror finished). The second sealing member 30 is also preferably made of an AT-cut crystal plate as in the case of the crystal resonator plate 10, and the respective directions of the X axis, Y axis and Z' axis of the second sealing member 30 are preferably the same as those of the crystal resonator plate 10.

On the first main surface 301 of the second sealing member 30, a sealing-member-side second bonding pattern 31 is formed as a sealing-member-side second sealing part so as to be bonded to the crystal resonator plate 10. The sealing-member-side second bonding pattern 31 is formed so as to have an annular shape in plan view.

On the second main surface 302 of the second sealing member 30, four electrode terminals 32 are formed. The electrode terminals 32 are respectively located on the four corners (corner parts) on the second main surface 302 of the second sealing member 30. In this embodiment, the electrical connection to the outside is carried out via the electrode patterns 22 and the wires 6a as described above. However, it is also possible to carry out the electrical connection to the outside via the electrode terminals 32.

As shown in FIGS. 9 and 10, four through holes are formed in the second sealing member 30 so as to penetrate between the first main surface 301 and the second main surface 302. More specifically, four sixth through holes 33 are respectively disposed in the four corners (corner parts) of the second sealing member 30. In the sixth through holes 33, through electrodes are respectively formed along a corresponding inner wall surface of the sixth through holes 33 so as to establish conduction between the electrodes formed on the first main surface 301 and the second main surface 302.

In this way, the respective electrodes formed on the first main surface 301 are electrically conducted to the electrode terminals 32 formed on the second main surface 302 via the through electrodes formed along the inner wall surfaces of the sixth through holes 33. Also, respective central parts of the sixth through holes 33 are hollow penetrating parts penetrating between the first main surface 301 and the second main surface 302. On the first main surface 301 of the second sealing member 30, connection bonding patterns 34 are respectively formed on the peripheries of the sixth through holes 33. When the electrical connection to the outside is not carried out via the electrode terminals 32, it is not necessarily required to provide the electrode terminals 32, the sixth through holes 33 and the like.

In the crystal oscillator 100 including the crystal resonator plate 10, the first sealing member 20 and the second sealing member 30, the crystal resonator plate 10 and the first sealing member 20 are subjected to the diffusion bonding in a state in which the resonator-plate-side first bonding pattern 121 and the sealing-member-side first bonding pattern 24 are superimposed on each other, and the crystal resonator plate 10 and the second sealing member 30 are subjected to the diffusion bonding in a state in which the resonator-plate-side second bonding pattern 122 and the sealing-member-side second bonding pattern 31 are superimposed on each other, thus, the package having the sandwich structure as shown in FIG. 4 is produced. Accordingly, the internal space of the package, i.e. the space to house the vibrating part 11 is hermetically sealed.

In this case, the respective connection bonding patterns as described above are also subjected to the diffusion bonding in a state in which they are each superimposed on the corresponding connection bonding pattern. Such bonding between the connection bonding patterns allows electrical conduction of the first excitation electrode 111, the second excitation electrode 112, the oscillation IC 51 and the electrode terminals 32 of the crystal oscillator 100.

More specifically, the first excitation electrode 111 is connected to the oscillation IC 51 via the first lead-out wiring 113, the wiring pattern 27, the fourth through hole 212 and the electrode pattern 22 in this order. The second excitation electrode 112 is connected to the oscillation IC 51 via the second lead-out wiring 114, the second through hole 162, the fifth through hole 213 and the electrode pattern 22 in this order.

In the crystal oscillator 100, the bonding patterns are each preferably made of a plurality of layers laminated on the crystal plate, specifically, a Ti (titanium) layer and an Au (gold) layer deposited by the vapor deposition in this order from the lowermost layer side. Also, the other wirings and electrodes formed on the crystal oscillator 100 each preferably have the same configuration as the bonding patterns, which leads to patterning of the bonding patterns, the wirings and the electrodes at the same time.

In the above-described crystal oscillator 100, sealing parts (seal paths) 115 and 116 that hermetically seal the vibrating part 11 of the crystal resonator plate 10 are formed so as to have an annular shape in plan view. The seal path 115 is formed by the diffusion bonding of the resonator-plate-side first bonding pattern 121 and the sealing-member-side first bonding pattern 24 as described above. The outer edge and the inner edge of the seal path 115 both have a substantially octagonal shape. In the same way, the seal path 116 is formed by the diffusion bonding of the resonator-plate-side second bonding pattern 122 and the sealing-member-side second bonding pattern 31 as described above. The outer edge and the inner edge of the seal path 116 both have a substantially octagonal shape.

In this embodiment as described above, the core section 5 is supported by the package 2 via the core substrate 4. Also, the core substrate 4 is connected to the package 2 at a position outside a region where the core section 5 is provided in plan view. Thus, the current to be applied to the heating element is controlled by the heater IC 52 to adjust the temperature of the core section 5. As a result, the temperature of the core section 5 is kept substantially constant.

The core section 5 has a layered structure of the oscillation IC 51, the crystal resonator 50 and the heater IC 52. The respective areas thereof in plan view become gradually larger from the upside to the downside. That is, the respective areas become gradually larger in the order of the oscillation IC 51, the crystal resonator 50 and the heater IC 52. The region where the core section 5 is provided in plan view means a bonding region where the core substrate 4 is bonded to a component to be directly bonded to the core substrate 4 among the components of the core section 5. In this embodiment, it is a bonding region where the core substrate 4 is bonded to the heater IC 52.

As shown in FIG. 3, the connecting parts 7a that connect the core substrate 4 and the package 2 via the conductive adhesive 7 are provided outside the region where the core section 5 is provided (i.e. the region where the heater IC 52 is provided) in plan view. The connecting parts 7a are provided on the peripheral part of the core substrate 4 in plan view and located at positions that are not superimposed on the region where the core section 5 is provided. Furthermore, the connecting parts 7a are provided each at a certain interval from the region where the core section 5 is provided.

In this embodiment, the connecting parts 7a are not provided at the positions that are superimposed on the core section 5 in plan view, and furthermore are provided at the positions away from the core section 5. Thus, heat of the core section 5 is not likely to transfer (leak) to the package 2 via the connecting parts 7a, and therefore, a large portion of heat generated from the heating element of the heater IC 52 can be maintained within the core section 5. Thus, it is possible to reduce, as much as possible, the amount of heat generated by the heater that is necessary to maintain the temperature of the core section 5, which leads to reduction in power consumption of the OCXO 1. Also, since the core section 5 is fixed to the package 2 via the core substrate 4, stress from a mounting board on which the OCXO 1 is mounted is not likely to transfer to the core section 5, which results in protection of the core section 5.

Also, since the void space 2d is provided between the core substrate 4 and the inner bottom surface of the package 2, it is possible to improve heat insulation of the core section 5 by the void space 2d. Thus, it is possible to further reduce the amount of heat generated by the heater that is necessary to maintain the temperature of the core section 5, which leads to further reduction in power consumption of the OCXO 1.

Here, the pair of step parts 2c facing each other is formed inside the package 2, and the void space 2d is formed by a recess part between the pair of step parts 2c. Furthermore, the recess part between the step parts 2c is formed at a position corresponding to the core section 5 in plan view (in this case, under the core section 5). More specifically, the recess part between the step parts 2c is provided at a position that is superimposed on the core section 5 in plan view, and the whole core section 5 is housed in the recess part between the step parts 2c.

In this way, since the step parts 2c are provided inside the package 2, it is possible to reliably ensure the void space 2d between the core substrate 4 and the inner bottom surface of the package 2. Also, in the event that the adhesive to bond the core substrate 4 and the package 2 overflows to the inner bottom surface of the package 2, the adhesive flows into the recess part. Thus, it is possible to prevent short circuit due to contact of the adhesives. Furthermore, since the recess part between the step parts 2c is provided at a position corresponding to the core section 5, it is possible to further improve heat insulation of the core section 5 by the recess part.

Furthermore in this embodiment, the crystal resonator 50 having the sandwich structure is used as the piezoelectric resonator of the core section 5, which hermetically seals the vibrating part 11 in the inside and is capable of having a reduced height. Thus, it is possible to reduce the height and the size of the core section 5, and furthermore the heat capacity of the core section 5 can be reduced. Therefore, it is possible to reduce the amount of heat generated by the heater of the OCXO 1, which leads to low power consumption. Furthermore, the temperature followability of the core section 5 can be improved, which also improves the stability of the OCXO 1. In addition, in the crystal resonator 50 having the sandwich structure, the vibrating part 11 is hermetically sealed without using any adhesive, as described above. Thus, it is possible to prevent thermal convection by outgas generated by the adhesive from affecting. That is, when the adhesive is used, the thermal convection may be generated, in the space in which the vibrating part 11 is hermetically sealed, by circulation of outgas generated by the adhesive, which may prevent the temperature of the vibrating part 11 from being accurately adjusted. However, the crystal resonator 50 having the sandwich structure does not generate outgas. Thus, it is possible to accurately control the temperature of the vibrating part 11.

When a heater substrate having a heater resistor is used as a heat source of the core section 5, such a heater substrate may have a large size. However, in this embodiment, it is possible to ensure a required amount of heat generated by the heater without using the heater substrate having a large size. Thus, it is possible to further reduce the size of the core section 5 and to further decrease the heat capacity of the core section 5. In the case where the size of the core section 5 is not limited, it is possible to use a heater substrate having a heater resistor as a heat source of the core section 5.

The crystal resonator plate 10 includes: the vibrating part 11 formed so as to have a substantially rectangular shape; the external frame part 12 surrounding the outer periphery of the vibrating part 11; and the support part 13 that connects the vibrating part 11 to the external frame part 12. Also, the oscillation IC 51 is overlapped with at least part of the external frame part 12 of the crystal resonator plate 10 in plan view. Therefore, heat of the oscillation IC 51 is easily transferred to the vibrating part 11 of the crystal resonator plate 10 via the external frame part 12, which contributes to further homogenization of the temperature of the core section 5.

The package 2 suffers heat damage and over time damage due to hermetical sealing, aging, deterioration over time and the like. Thus, when a resin adhesive with low heat resistance is used as the adhesive (for example, the conductive adhesives 7 and 55, and the non-conductive adhesives 53 and 54), it may generate gas in the package 2 by decomposition or softening, which may affect high accuracy in the temperature adjustment of the OCXO 1. In this embodiment taking into account the above, a polyimide adhesive or an epoxy adhesive with low thermal conductivity and high heat resistance is used as the adhesive so as to prevent the above problems.

The present invention may be embodied in other forms without departing from the gist or essential characteristics thereof. The foregoing embodiment is therefore to be considered in all respects as illustrative and not limiting. The scope of the invention is indicated by the appended claims rather than by the foregoing description, and all modifications and changes that come within the meaning and range of equivalency of the claims are intended to be embraced therein.

In the above embodiment, the void space 2d is formed between the core substrate 4 and the inner bottom surface of the package 2 by providing the step parts 2c inside the package 2. However, the step parts 2c are not necessarily required in the package 2. For example, the core substrate 4 may be bonded to the connection terminals formed on the inner bottom surface of the package 2 by the conductive adhesive, and the void space 2d may be formed between the core substrate 4 and the inner bottom surface of the package 2 by the conductive adhesive that is interposed between the core substrate 4 and the package 2. In this case, the conductive adhesive is applied so as to have a certain thickness, and this thickness of the conductive adhesive ensures the void space 2d between the core substrate 4 and the inner bottom surface of the package 2. With this configuration, it is possible to form the void space 2d between the core substrate 4 and the inner bottom surface of the package 2 by a simple method using the adhesive to bond the core substrate 4 and the package 2.

In the above-described embodiment, the crystal resonator 50 having the sandwich structure is used as the piezoelectric resonator. However, the present invention is not limited thereto. A piezoelectric resonator having another structure may also be used. Furthermore, the oscillation IC 51 is mounted on the crystal resonator 50 by the FCB (Flip Chip Bonding) method using the metal bumps. However, the present invention is not limited thereto. The oscillation IC 51 may be mounted on the crystal resonator 50 by wire bonding or by the conductive adhesive. Also, the heater IC 52 is mounted on the core substrate 4 by wire bonding. However, the present invention is not limited thereto. The heater IC 52 may be mounted on the core substrate 4 by the FCB method using the metal bumps or by the conductive adhesive. Also, the crystal resonator 50 is electrically connected to the core substrate 4 by wire bonding. However, the present invention is not limited thereto. The crystal resonator 50 may be electrically connected to the core substrate 4 via the heater IC 52 by mounting the crystal resonator 50 on the heater IC 52 by the FCB method using the metal bumps or by the conductive adhesive.

Figure 11:
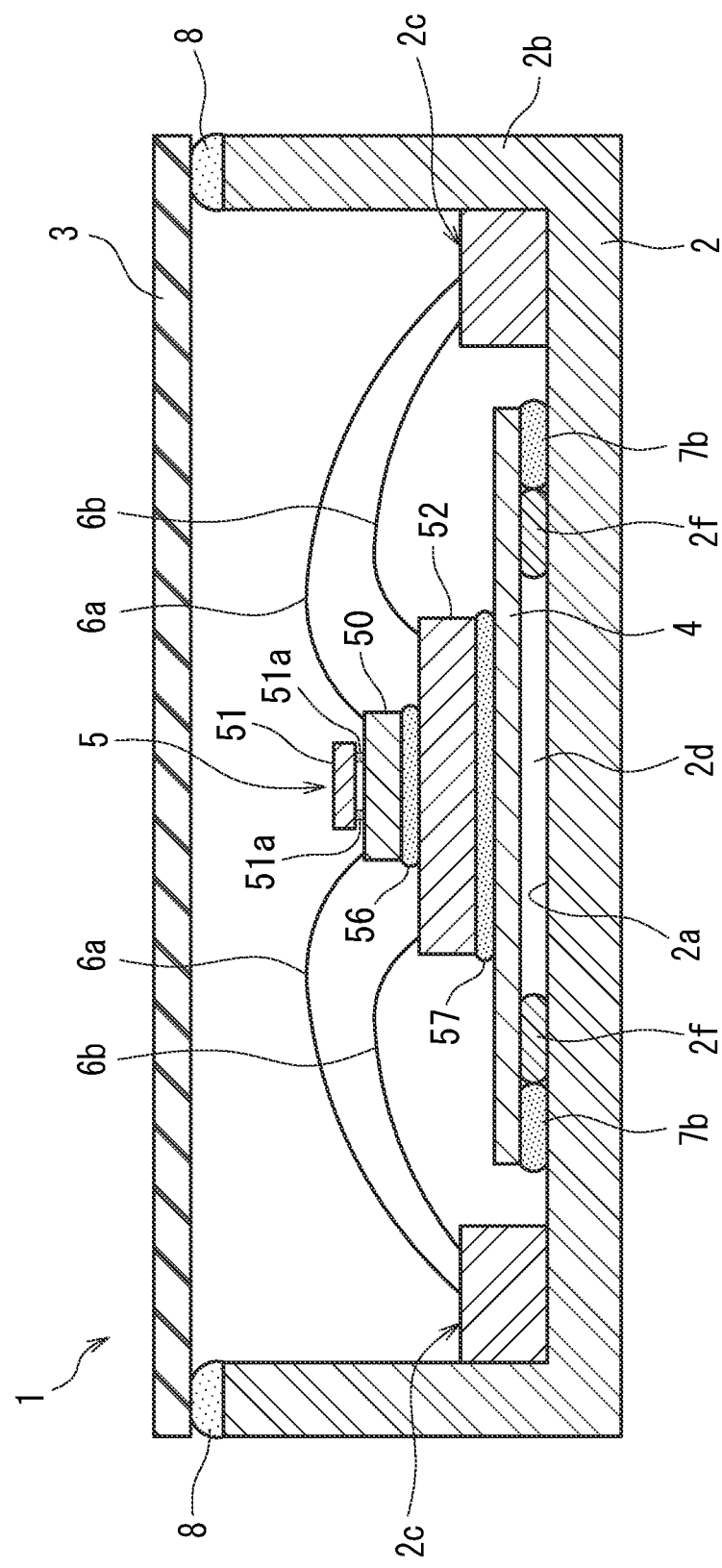
FIG. 11 is a cross-sectional view illustrating a schematic configuration of an OCXO according to variation 1.
Figure 12:
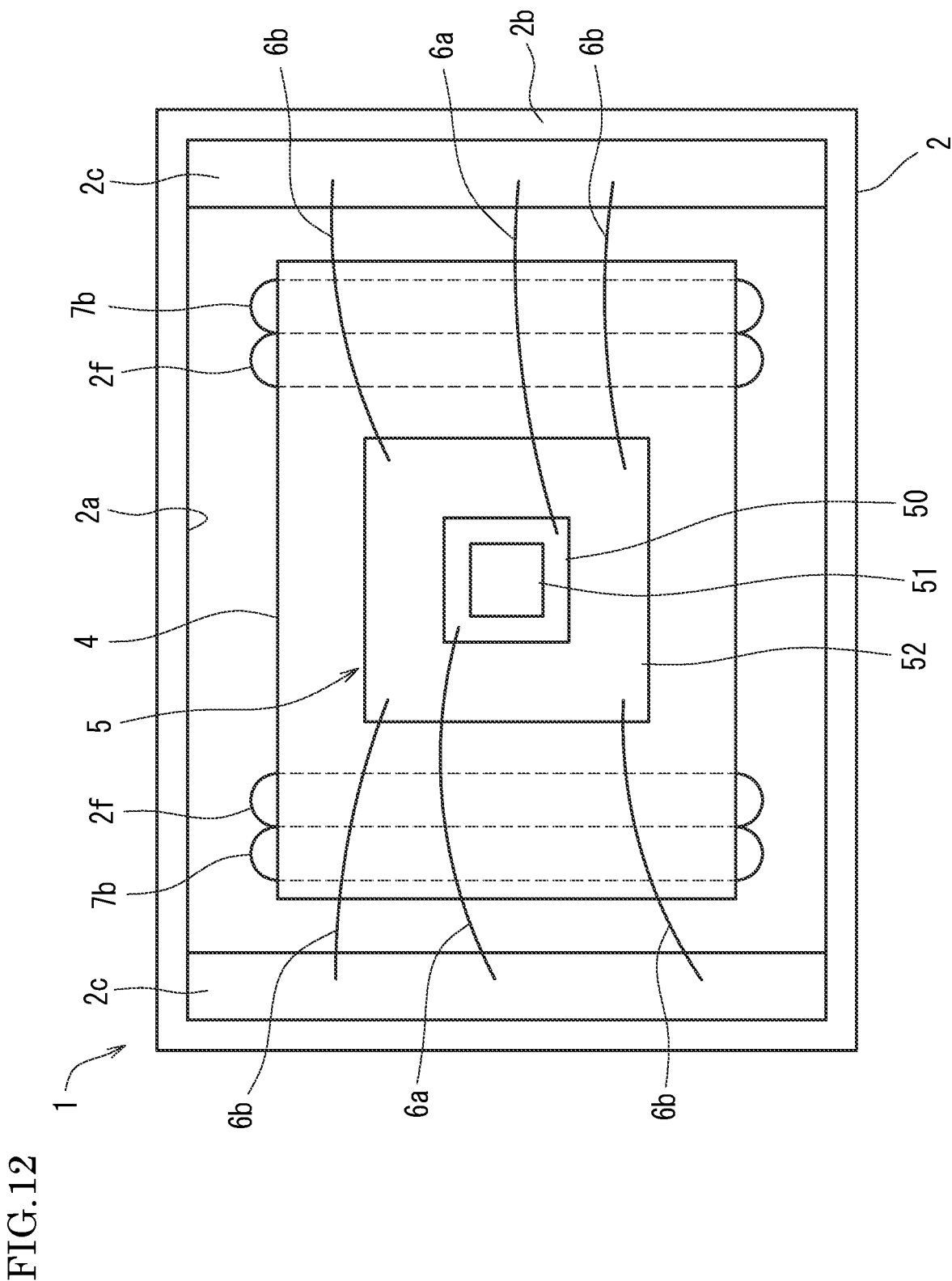
FIG. 12 is a plan view of the OCXO of FIG. 11.
Figure 13:
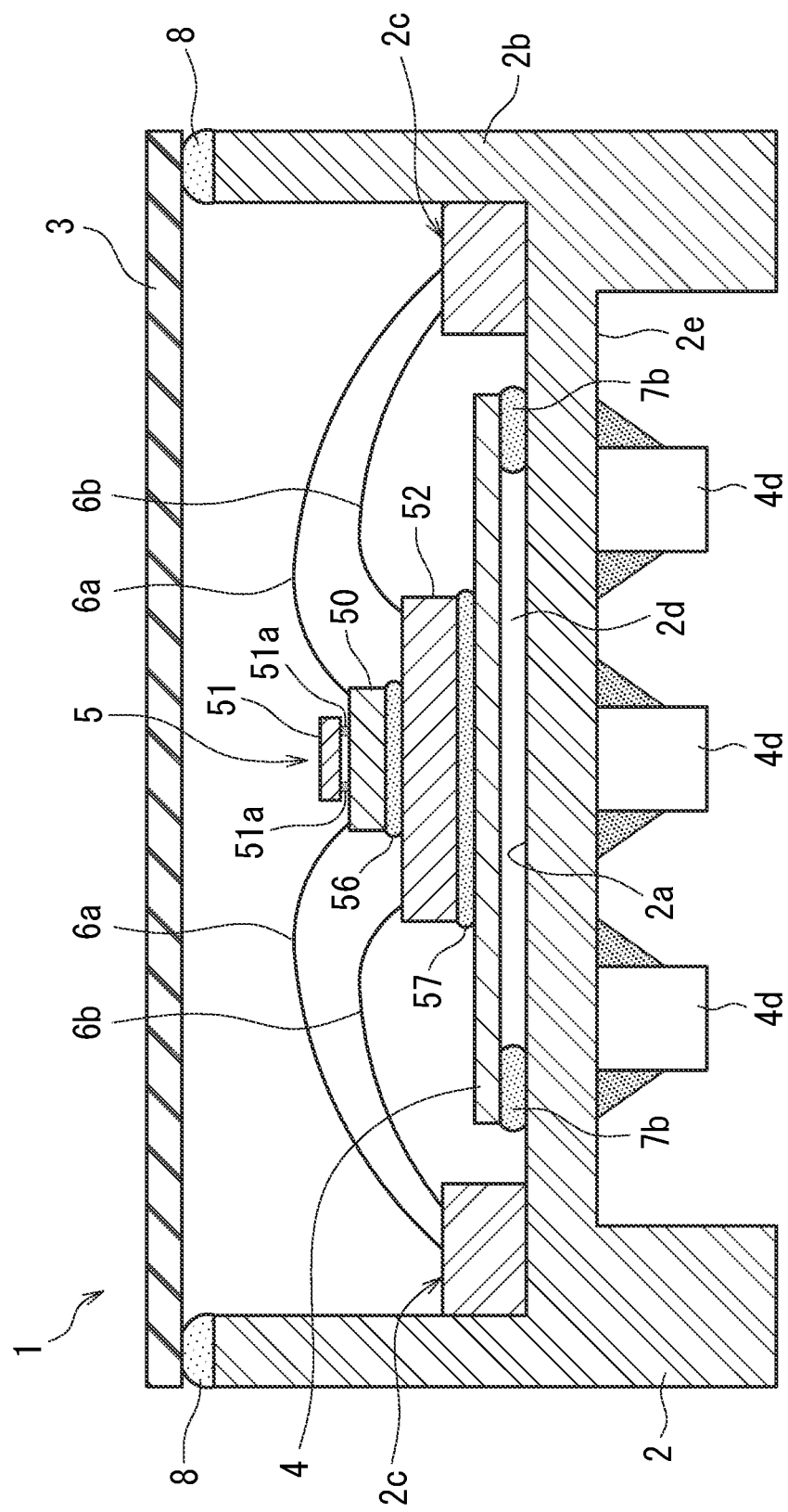
FIG. 13 is a cross-sectional view illustrating a schematic configuration of an OCXO according to variation 2.

Also, as shown in variation 1 indicated in FIGS. 11 and 12 or variation 2 indicated in FIG. 13, the core section 5 may be electrically connected to the package 2 by wire bonding. Alternatively, the core substrate 4 may be electrically connected to the package 2 by the FCB method using the metal bumps, although it is not shown in the drawings. Thus, it is possible to electrically connect the core substrate 4 to the package 2 by the mechanical connection (for example, by the conductive adhesive, by the wire bonding and by the FCB method using the metal bumps).

When the core substrate 4 is connected to the inner bottom surface of the package 2 by the mechanical connection, it is possible to reduce the height of the OCXO 1 compared to the case in which the core substrate 4 is connected to the upper surfaces of the pair of step parts 2c (see FIG. 1). Also, when the core substrate 4 is connected to the package 2 by the mechanical and insulating (non-conductive) connection, the heat of the core section 5 is not likely to transfer (leak) to the package 2, and thus a large portion of heat generated from the heating element of the heater IC 52 can be maintained within the core section 5. Accordingly, it is possible to reduce, as much as possible, the amount of heat generated by the heater that is necessary to maintain the temperature of the core section 5, which leads to reduction in power consumption of the OCXO 1. When the core substrate 4 is connected to the package 2 by the mechanical and insulating connection, the core section 4 may be electrically connected to the package 2 by the wire bonding.

The above-described layout of the connecting parts 7a of the core substrate 4 and the package 2 is exemplarily described. The connecting parts 7a may be located at positions other than those in the above example provided that they are located outside the region where the core section 5 is located in plan view. That is, the connecting parts 7a may be located at positions other than those in the above example to the extent that the positions are not superimposed on the core section 5 in plan view.

In the above-described embodiment, the core section 5 has a structure in which at least the oscillation IC 51, the crystal resonator 50 and the heater IC 52 are laminated in this order from the uppermost layer side. Contrarily, the core section 5 may have a structure in which at least the heater IC 52, the crystal resonator 50 and the oscillation IC 51 are laminated in this order from the uppermost layer side.

It is sufficient that the core section 5 has at least the oscillation IC 51, the crystal resonator 50 and the heater IC 52. That is, a heater substrate or the like may be added to the layered structure made of the oscillation IC 51, the crystal resonator 50, and the heater IC 52. For example, the core section 5 may have a four-layer structure in which the heater substrate, the oscillation IC 51, the crystal resonator 50 and the heater IC 52 are laminated in this order from the uppermost layer side, or also may have a four-layer structure in which the heater IC 52, the crystal resonator 50, the oscillation IC 51 and the heater substrate are laminated in this order from the uppermost layer side. In these cases, it is possible to further homogenize the temperature of the core section 5 by laminating the heater substrate as a heating element on the oscillation IC 51.

When the core section 5 has a four-layer structure in which the heater substrate, the oscillation IC 51, the crystal resonator 50 and the heater IC 52 are laminated in this order from the uppermost layer side, the bonding region of the core substrate 4 and the heater IC 52 to be directly connected to the core substrate 4 is a region where the core section 5 is provided. On the other hand, when the core section 5 has a four-layer structure in which the heater IC 52, the crystal resonator 50, the oscillation IC 51 and the heater substrate are laminated in this order from the uppermost layer side, the bonding region of the core substrate 4 and the heater substrate to be directly connected to the core substrate 4 is a region where the core section 5 is provided.

It is sufficient that the core section 5 has at least the oscillation IC 51, the crystal resonator 50 and the heater IC 52. That is, the core section 5 is not needed to have the above-described layered structure. For example, the core section 5 may have a heater substrate and a plurality of chip capacitors (bypass capacitors) in addition to the oscillation IC 51, the crystal resonator 50 and the heater IC 52. In this case, the bonding region of the core substrate 4 and the component to be directly connected to the core substrate 4 (for example, the heater substrate) is a region where the core section 5 is provided.

In the above-described embodiment, the core section 5 is electrically connected to the package 2 via the core substrate 4. However, the core section 5 may be electrically connected to the package 2 not via the core substrate 4. That is, at least one of the oscillation IC 51, the crystal resonator 50 and the heater IC 52, which constitute the core section 5, may be electrically connected to the package 2 via wires. In the OCXO 1 according to this variation will be described referring to FIGS. 11 and 12. FIG. 11 is a cross-sectional view illustrating a schematic configuration of the OCXO 1 according to variation 1. FIG. 12 is a plan view of the OCXO 1 of FIG. 11.

As shown in FIGS. 11 and 12, the OCXO 1 according to variation 1 has a configuration in which the core section 5 is disposed in the package (housing) 2 made of ceramic or the like and having a substantially rectangular parallelepiped shape such that the core section 5 is hermetically sealed by the lid 3. The package 2 has, for example, a package size of 5.0×3.2 mm. The package 2 includes the recess part 2a whose upper part is opened, and the core section 5 is hermetically encapsulated in the recess part 2a. To the upper surface of the peripheral wall part 2b that surrounds the recess part 2a, the lid 3 is fixed by seam welding via the sealant 8. Thus, the inside of the package 2 is hermetically sealed (in the airtight state). As the sealant 8, a metal sealant such as Au-Su alloy and solder is suitably used, and other sealants including low melting point glass may also be used. However, the present invention is not limited thereto. The sealing may also be performed by seam welding with metal rings, direct seam welding without metal rings, or by beam welding. (However, note that the seam welding is preferred from the viewpoint of prevention of loss of vacuum). The space inside the package 2 is preferably in a vacuum state (for example, with the degree of vacuum not more than 10 Pa) or an atmosphere with low thermal conductivity with low pressure nitrogen or low pressure argon. FIG. 12 shows the OCXO 1 with the lid 3 being removed in order to indicate the internal configuration of the OCXO 1.

The step parts 2c are formed on the inner wall surface of the peripheral wall part 2b of the package 2 so as to be along the arrangement of the connection terminals (not shown). The core section 5 is disposed on the bottom surface of the recess part 2a (on the inner bottom surface of the package 2) between the facing pair of step parts 2c via the plate-like core substrate 4. Alternatively, the step parts 2c may be formed to surround the four sides of the bottom surface of the recess part 2a. The core substrate 4 is made of a resin material having heat resistance and flexibility such as polyimide. The core substrate 4 may be made of crystal.

The core substrate 4 is bonded to the bottom surface of the recess part 2a (i.e. the inner bottom surface of the package 2) via a non-conductive adhesive 7b, and the void space 2d is formed under the core substrate 4. Also, the external terminals (not shown) formed on the respective components of the core section 5 are connected to the connection terminals formed on the step surfaces of the step parts 2c by the wire bonding via the wires 6a and 6b. On the respective inner sides of the non-conductive adhesives 7b, spacer members 2f are provided.

The non-conductive adhesives 7b are disposed on both end parts of the core substrate 4 in the long-side direction so as to be straight lines extending in the short-side direction of the core substrate 4 (i.e. in the direction orthogonally intersecting with the direction of the sheet on which FIG. 12 is illustrated). Each spacer member 2f is located side by side with the corresponding non-conductive adhesive 7b so as to be a straight line extending in the short-side direction of the core substrate 4. Thus, the respective spacer members 2f are interposed, each inside the corresponding non-conductive adhesive 7b, between the core substrate 4 and the inner bottom surface of the package 2. Both end parts of the core substrate 4 in the long-side direction are supported by the respective spacer members 2f.

The core substrate 4 is made of a resin material having heat resistance and flexibility such as polyimide. The spacer member 2f is made of a paste material such as molybdenum and tungsten. In this way, between the core substrate 4 and the inner bottom surface of the package 2, there are interposed substances such as the non-conductive adhesives 7b and the spacer members 2f. Thus, it is possible to easily ensure the void space 2d between the core substrate 4 and the inner bottom surface of the package 2 by the interposed substances. Also, the thickness of the non-conductive adhesive 7b applied onto the inner bottom surface of the package 2 is defined by the spacer member 2f, which also results in easy definition of the width of the void space 2d between the core substrate 4 and the inner bottom surface of the package 2. The thickness of the spacer member 2f is preferably 5 to 50 μm. Also, no underfill is interposed between the respective facing surfaces of the crystal resonator 50 and the oscillation IC 51. The respective facing surfaces of the crystal resonator 50 and the oscillation IC 51 are fixed to each other by a plurality of metal bumps 51a so as to avoid influence by stress caused by the underfill. However, the underfill may be interposed between the respective facing surfaces of the crystal resonator 50 and the oscillation IC 51. Furthermore, the conductive adhesive 56 is interposed between the respective facing surfaces of the crystal resonator 50 and the heater IC 52. However, it may be the non-conductive adhesive that interposes between the respective facing surfaces of the crystal resonator 50 and the heater IC 52.

In the above-described embodiments, the package 2 is a single package. However, the present invention is not limited thereto. It is possible to use, for example, an H-shaped package as shown in FIG. 13, or a stacked configuration of two packages. FIG. 13 is a cross-sectional view illustrating a schematic configuration of the OCXO 1 according to variation 2.

As shown in FIG. 13, the OCXO 1 with the H-shaped package includes the package 2 that has a recess part 2e whose lower part is opened, apart from the recess part 2a whose upper part is opened. In the recess part 2e that is formed in a second main surface that is opposite to a first main surface on which the core section 5 is mounted (i.e. the first main surface in which the recess part 2a is formed), it is possible to dispose a circuit component (for example, a circuit component attached by soldering) such as a chip capacitor 4d as an electronic component for adjustment that is used in combination with the heater IC 52. Unlike the recess part 2a, the recess part 2e in which the chip capacitor 4d is disposed is not needed to be sealed by the lid.

Here, the chip capacitor 4d can be disposed in the space where the core section 5 is housed (i.e. in the recess part 2a). However, it is possible to reduce the heat capacity in the space where the core section 5 is housed by providing the circuit component in the space (i.e. in the recess part 2e) other than that where the core section 5 is housed, as shown in FIG. 13. Thus, it is possible to control the temperature with low electric power and furthermore to improve the temperature followability of the core section 5. Also, it is possible to prevent subsequent generation of gas due to soldering or flux in the inner atmosphere of the hermetically sealed recess part 2a. Therefore, the core section 5 is not affected by the gas, which is desirable in order to realize further stabilization of electrical characteristics.

This application claims priority based on Patent Application No. 2020-149902 filed in Japan on Sep. 7, 2020. The entire contents thereof are hereby incorporated in this application by reference.

INDUSTRIAL APPLICABILITY

The present invention is suitably applied to an oven-controlled crystal oscillator including a core section having a piezoelectric resonator, an oscillation IC, and a heater IC.

DESCRIPTION OF REFERENCE NUMERALS

1 Oven-controlled crystal oscillator
2 Package
4 Core substrate
5 Core section
7 Adhesive
7a Connecting part
50 Crystal resonator (piezoelectric resonator)
51 Oscillation IC
52 Heater IC

The invention claimed is:

1. An oven-controlled crystal oscillator comprising a core section including at least an oscillation IC, a piezoelectric resonator, and a heater IC, the core section being hermetically encapsulated in a heat-insulating package, wherein
   the core section has a layered structure in which the piezoelectric resonator and the heater IC are laminated, and an area of the heater IC is greater than an area of the piezoelectric resonator,
   the core section is supported by the heat-insulating package via a core substrate, and
   the core substrate is connected to the heat-insulating package outside a region where the core section is provided in plan view.

2. The oven-controlled crystal oscillator according to claim 1, wherein
   the core substrate is connected to the heat-insulating package by mechanical connection.

3. The oven-controlled crystal oscillator according to claim 1, wherein
   a void space is provided between the core substrate and an inner bottom surface of the heat-insulating package.

4. The oven-controlled crystal oscillator according to claim 3, wherein
   the core substrate is bonded to the package by an adhesive, and
   the void space is formed by the adhesive that is interposed between the core substrate and the heat-insulating package.

5. The oven-controlled crystal oscillator according to claim 3, wherein
   a pair of step parts facing each other is formed inside the heat-insulating package, and
   the void space is formed by a recess part formed between the pair of step parts.

6. The oven-controlled crystal oscillator according to claim 5, wherein
   the recess part is formed at a position corresponding to the core section in plan view.

7. The oven-controlled crystal oscillator according to claim 1, wherein
   the piezoelectric resonator includes: a first sealing member and a second sealing member both made of glass or crystal; and a piezoelectric resonator plate made of crystal,
   the piezoelectric resonator plate has a vibrating part, on respective main surfaces of which excitation electrodes are formed, and
   the first sealing member and the second sealing member are laminated and bonded to each other via the piezoelectric resonator plate so as to hermetically seal the vibrating part of the piezoelectric resonator plate in an internal space.

8. The oven-controlled crystal oscillator according to claim 1, wherein
   the oscillation IC, the piezoelectric resonator, and the heater IC are arranged in the recited order, such that an area of the oscillation IC is smaller than the area of the piezoelectric resonator in plan view.

* * * * *